(12) United States Patent
Liao et al.

(10) Patent No.: US 9,070,793 B2
(45) Date of Patent: Jun. 30, 2015

(54) SEMICONDUCTOR DEVICE PACKAGES HAVING ELECTROMAGNETIC INTERFERENCE SHIELDING AND RELATED METHODS

(75) Inventors: Kuo-Hsien Liao, Taichung (TW); Chi-Hong Chan, Hong Kong (CN); Jian-Cheng Chen, Tainan (TW); Chian-Her Ueng, Chaozhou Township, Pingtung County (TW); Yu-Hsiang Sun, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 626 days.

(21) Appl. No.: 13/114,915

(22) Filed: May 24, 2011

(65) Prior Publication Data
US 2012/0025356 A1    Feb. 2, 2012

(30) Foreign Application Priority Data

Aug. 2, 2010    (TW) ................................ 99125651 A

(51) Int. Cl.
| | | |
|---|---|---|
| H01L 23/552 | (2006.01) | |
| H01L 23/00 | (2006.01) | |
| H01L 23/31 | (2006.01) | |

(Continued)

(52) U.S. Cl.
CPC ............ *H01L 24/97* (2013.01); *H01L 23/3121* (2013.01); *H01L 23/49805* (2013.01); *H01L 23/552* (2013.01); *H01L 24/16* (2013.01); *H01L 24/48* (2013.01); *H01L 25/0655* (2013.01); *H01L 2224/48227* (2013.01); *H01L 2224/97* (2013.01); *H01L 2924/01013* (2013.01); *H01L 2924/01029* (2013.01); *H01L 2924/0103* (2013.01); *H01L 2924/01047* (2013.01); *H01L 2924/01078* (2013.01); *H01L 2924/01079* (2013.01); *H01L 2924/01024* (2013.01); *H01L 2924/01033* (2013.01); *H01L 2924/01074* (2013.01); *H01L 2924/01075* (2013.01); *H01L 2924/014* (2013.01); *H01L 2924/3025* (2013.01); *H01L 2924/1461* (2013.01)

(58) Field of Classification Search
CPC ... H01L 21/78; H01L 2224/97; H01L 23/552; H01L 2924/3025
USPC .......................... 257/659, 664, 662, 508, 660
See application file for complete search history.

(56) References Cited

U.S. PATENT DOCUMENTS

| | | | |
|---|---|---|---|
| 3,390,226 | A | 6/1968 | Beyerlein |
| 4,569,786 | A | 2/1986 | Deguchi |

(Continued)

FOREIGN PATENT DOCUMENTS

| | | |
|---|---|---|
| CN | 1442033 | 9/2003 |
| CN | 1774804 | 5/2006 |

(Continued)

*Primary Examiner* — Whitney T Moore
*Assistant Examiner* — Joseph Galvin, III
(74) *Attorney, Agent, or Firm* — Klein, O'Neill & Singh, LLP

(57) ABSTRACT

The semiconductor device package includes a conformal shield layer applied to the exterior surface of the encapsulant, and an internal fence or separation structure embedded in the encapsulant. The fence separates the package into various compartments, with each compartment containing at least one die. The fence thus suppresses EMI between adjacent packages. The package further includes a ground path connected to the internal fence and conformal shield.

20 Claims, 11 Drawing Sheets

(51) Int. Cl.
    *H01L 23/498*    (2006.01)
    *H01L 25/065*    (2006.01)

(56)         References Cited

U.S. PATENT DOCUMENTS

| | | | |
|---|---|---|---|
| 4,717,948 A | 1/1988 | Sakai et al. |
| 4,814,205 A | 3/1989 | Arcilesi et al. |
| 4,821,007 A | 4/1989 | Fields et al. |
| 5,140,745 A | 8/1992 | McKenzie, Jr. |
| 5,166,772 A | 11/1992 | Soldner et al. |
| 5,172,077 A | 12/1992 | Funada |
| 5,353,498 A | 10/1994 | Fillion et al. |
| 5,355,016 A | 10/1994 | Swirbel et al. |
| 5,557,142 A | 9/1996 | Gilmore et al. |
| 5,600,181 A | 2/1997 | Scott et al. |
| 5,639,989 A | 6/1997 | Higgins, III |
| 5,677,511 A | 10/1997 | Taylor et al. |
| 5,694,300 A | 12/1997 | Mattei et al. |
| 5,703,761 A | 12/1997 | Heiss |
| 5,726,612 A | 3/1998 | Mandai et al. |
| 5,729,437 A | 3/1998 | Hashimoto |
| 5,776,798 A | 7/1998 | Quan et al. |
| 5,847,930 A | 12/1998 | Kazle |
| 5,864,088 A | 1/1999 | Sato et al. |
| 5,886,876 A | 3/1999 | Yamaguchi |
| 5,895,229 A | 4/1999 | Carney et al. |
| 5,898,344 A | 4/1999 | Hayashi |
| 5,966,052 A | 10/1999 | Sakai |
| 5,977,626 A | 11/1999 | Wang et al. |
| 5,998,867 A | 12/1999 | Jensen et al. |
| 6,079,099 A | 6/2000 | Uchida et al. |
| 6,093,972 A | 7/2000 | Carney et al. |
| 6,150,193 A | 11/2000 | Glenn |
| 6,194,250 B1 | 2/2001 | Melton et al. |
| 6,225,694 B1 | 5/2001 | Terui |
| 6,255,143 B1 | 7/2001 | Briar |
| 6,261,680 B1 | 7/2001 | Denman |
| 6,369,335 B1 | 4/2002 | Wajima |
| 6,376,769 B1 | 4/2002 | Chung |
| 6,448,632 B1 | 9/2002 | Takiar et al. |
| 6,455,864 B1 | 9/2002 | Featherby et al. |
| 6,472,598 B1 | 10/2002 | Glenn |
| 6,472,743 B2 | 10/2002 | Huang et al. |
| 6,479,903 B2 | 11/2002 | Briar |
| 6,492,194 B1 | 12/2002 | Bureau et al. |
| 6,521,978 B2 | 2/2003 | Fenk et al. |
| 6,566,596 B1 | 5/2003 | Askew |
| 6,586,822 B1 | 7/2003 | Vu et al. |
| 6,602,737 B2 | 8/2003 | Wu |
| 6,614,102 B1 | 9/2003 | Hoffman et al. |
| 6,635,953 B2 | 10/2003 | Wu |
| 6,686,649 B1 | 2/2004 | Mathews et al. |
| 6,695,985 B2 | 2/2004 | Igarashi et al. |
| 6,740,546 B2 | 5/2004 | Corisis et al. |
| 6,740,959 B2 | 5/2004 | Alcoe et al. |
| 6,757,181 B1 | 6/2004 | Villanueva |
| 6,781,231 B2 | 8/2004 | Minervini |
| 6,800,804 B2 | 10/2004 | Igarashi et al. |
| 6,838,776 B2 | 1/2005 | Leal et al. |
| 6,856,007 B2 | 2/2005 | Warner |
| 6,865,084 B2 | 3/2005 | Lin et al. |
| 6,881,896 B2 | 4/2005 | Ebihara |
| 6,900,383 B2 | 5/2005 | Babb et al. |
| 6,928,719 B2 | 8/2005 | Kim et al. |
| 6,962,869 B1 | 11/2005 | Bao et al. |
| 6,967,403 B2 | 11/2005 | Chuang et al. |
| 6,975,516 B2 | 12/2005 | Asahi et al. |
| 6,992,400 B2 | 1/2006 | Tikka et al. |
| 6,998,532 B2 | 2/2006 | Kawamoto et al. |
| 7,030,469 B2 | 4/2006 | Mahadevan et al. |
| 7,045,385 B2 | 5/2006 | Kim et al. |
| 7,049,682 B1 | 5/2006 | Mathews et al. |
| 7,081,661 B2 | 7/2006 | Takehara et al. |
| 7,161,252 B2 | 1/2007 | Tsuneoka et al. |
| 7,180,012 B2 | 2/2007 | Tsuneoka et al. |
| 7,183,498 B2 | 2/2007 | Ogura et al. |
| 7,187,060 B2 | 3/2007 | Usui |
| 7,294,587 B2 | 11/2007 | Asahi et al. |
| 7,327,015 B2 | 2/2008 | Yang et al. |
| 7,342,303 B1 | 3/2008 | Berry et al. |
| 7,372,151 B1 | 5/2008 | Fan et al. |
| 7,445,968 B2 | 11/2008 | Harrison et al. |
| 7,446,265 B2 | 11/2008 | Krohto et al. |
| 7,451,539 B2 | 11/2008 | Morris et al. |
| 7,478,474 B2 | 1/2009 | Koga |
| 7,488,903 B2 | 2/2009 | Kawagishi et al. |
| 7,576,415 B2 | 8/2009 | Cha et al. |
| 7,629,674 B1 | 12/2009 | Foster |
| 7,633,170 B2 | 12/2009 | Yang et al. |
| 7,633,765 B1 | 12/2009 | Scanlan et al. |
| 7,656,047 B2 | 2/2010 | Yang et al. |
| 7,700,411 B2 | 4/2010 | Yang et al. |
| 7,745,910 B1 | 6/2010 | Olson et al. |
| 7,829,981 B2 | 11/2010 | Hsu |
| 2002/0053724 A1 | 5/2002 | Lai et al. |
| 2002/0093108 A1 | 7/2002 | Grigorov |
| 2004/0020673 A1 | 2/2004 | Mazurkiewicz |
| 2004/0063242 A1 | 4/2004 | Karnezos |
| 2004/0150097 A1 | 8/2004 | Gaynes et al. |
| 2004/0178500 A1 | 9/2004 | Usui |
| 2004/0231872 A1 | 11/2004 | Arnold et al. |
| 2004/0252475 A1 | 12/2004 | Tsuneoka et al. |
| 2005/0013082 A1 | 1/2005 | Kawamoto et al. |
| 2005/0029673 A1 | 2/2005 | Naka et al. |
| 2005/0039946 A1 | 2/2005 | Nakao |
| 2005/0045358 A1 | 3/2005 | Arnold |
| 2005/0208702 A1 | 9/2005 | Kim |
| 2006/0145361 A1 | 7/2006 | Yang et al. |
| 2006/0148317 A1 | 7/2006 | Akaike et al. |
| 2006/0160261 A1 | 7/2006 | Sheats et al. |
| 2006/0266547 A1 | 11/2006 | Koga |
| 2008/0042301 A1 | 2/2008 | Yang et al. |
| 2008/0061407 A1 | 3/2008 | Yang et al. |
| 2008/0128890 A1 | 6/2008 | Choi et al. |
| 2008/0174013 A1 | 7/2008 | Yang et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1* | 1/2009 | Carey et al. .......... 361/818 |
| 2009/0002972 A1 | 1/2009 | Carey et al. |
| 2009/0025211 A1 | 1/2009 | Hiner et al. |
| 2009/0035895 A1 | 2/2009 | Lee et al. |
| 2009/0075428 A1 | 3/2009 | Tang et al. |
| 2009/0102003 A1 | 4/2009 | Vogt et al. |
| 2009/0102033 A1 | 4/2009 | Raben |
| 2009/0194851 A1* | 8/2009 | Chiu et al. .......... 257/660 |
| 2009/0194852 A1 | 8/2009 | Chiu et al. |
| 2009/0230487 A1 | 9/2009 | Saitoh et al. |
| 2009/0230523 A1 | 9/2009 | Chien et al. |
| 2009/0230524 A1 | 9/2009 | Chien et al. |
| 2009/0230525 A1 | 9/2009 | Chien et al. |
| 2009/0230526 A1 | 9/2009 | Chen et al. |
| 2009/0236700 A1 | 9/2009 | Moriya |
| 2009/0256244 A1 | 10/2009 | Liao et al. |
| 2009/0261470 A1 | 10/2009 | Choi et al. |
| 2009/0294928 A1 | 12/2009 | Kim et al. |
| 2010/0006330 A1 | 1/2010 | Fu et al. |
| 2010/0013064 A1 | 1/2010 | Hsu |
| 2010/0032815 A1 | 2/2010 | An et al. |
| 2010/0109132 A1 | 5/2010 | Ko et al. |
| 2010/0110656 A1 | 5/2010 | Ko et al. |
| 2010/0199492 A1 | 8/2010 | Hiner et al. |
| 2010/0207257 A1 | 8/2010 | Lee |
| 2010/0207258 A1 | 8/2010 | Eun et al. |
| 2010/0207259 A1 | 8/2010 | Liao et al. |
| 2011/0006408 A1 | 1/2011 | Liao |
| 2011/0115059 A1 | 5/2011 | Lee et al. |
| 2011/0115060 A1 | 5/2011 | Chiu et al. |

(56) References Cited

U.S. PATENT DOCUMENTS

| | | | |
|---|---|---|---|
| 2011/0115066 A1 | 5/2011 | Kim et al. | |
| 2011/0127654 A1 | 6/2011 | Weng et al. | |

FOREIGN PATENT DOCUMENTS

| | | |
|---|---|---|
| JP | 55044737 | 3/1980 |
| JP | 58122759 | 7/1983 |
| JP | 59051555 | 3/1984 |
| JP | 63262860 | 10/1988 |
| JP | 64037043 | 2/1989 |
| JP | 64064298 | 3/1989 |
| JP | 2078299 | 3/1990 |
| JP | 3023654 | 1/1991 |
| JP | 3171652 | 7/1991 |
| JP | 4147652 | 5/1992 |
| JP | 4206858 | 7/1992 |
| JP | 5129476 | 5/1993 |
| JP | 08-288686 | 1/1996 |
| JP | 2003273571 | 9/2003 |
| WO | WO2004060034 | 7/2004 |
| WO | WO2006/076613 | 7/2006 |

* cited by examiner

SEMICONDUCTOR DEVICE PACKAGES HAVING ELECTROMAGNETIC INTERFERENCE SHIELDING AND RELATED METHODS

CROSS-REFERENCE TO RELATED APPLICATION

This application claims the benefit of Taiwan application Serial No. 99125651, filed on Aug. 2, 2010, the subject matter of which is incorporated herein by reference.

TECHNICAL FIELD

The present disclosure relates to semiconductors and more particularly to semiconductor assembly and packaging.

BACKGROUND

In response to demand for increased processing speed and reduced device size, semiconductor devices have become increasingly complicated. In smaller, lighter weight, and higher frequency electronic devices, transitions between signal levels are more frequent, creating stronger electromagnetic emissions. Performance of semiconductor devices in an electronic device can be negatively affected by electromagnetic emissions from other semiconductor devices in the same electronic device. The risk of such electromagnetic interference (EMI) increases as the density of semiconductor devices in a given electronic device increases.

One method for reducing EMI is to dispose an EMI shield frame on a substrate during the manufacturing process of a semiconductor device package. The EMI shield frame, which is typically metal, surrounds the semiconductor devices disposed on the substrate and may also separate neighboring semiconductor devices.

In some semiconductor devices, the substrate has a larger plan area than the EMI shield frame to facilitate erecting the EMI shield frame on the substrate. As a result, the final product has a larger size. In addition, during the manufacturing process, a given EMI shield frame is only compatible with a specific semiconductor device package type having the configuration for which the EMI shield frame was designed. Manufacturing different semiconductor device packages thus requires a larger inventory of compatible EMI shield frames.

SUMMARY

One of the present embodiments comprises a semiconductor device package. The package comprises a substrate including a carrier surface. The package further comprises a plurality of dies coupled to the carrier surface of the substrate and electrically connected to the substrate. The package further comprises an electromagnetic interference (EMI) shield, including a connecting element and a shield layer that are discrete components. The package further comprises a package body covering the dies and partially covering the connecting element except for an exposed portion spaced from the substrate. The connecting element extends between adjacent ones of the dies, thereby dividing the semiconductor device package into a plurality of compartments, with each compartment containing at least one of the dies. the shield layer is disposed over the package body and the exposed portion of the connecting element.

Another of the present embodiments comprises a semiconductor device package. The package comprises a substrate including a carrier surface. The package further comprises a plurality of dies coupled to the carrier surface of the substrate and electrically connected to the substrate, wherein each of the plurality of dies has an active surface. The package further comprises an electromagnetic interference (EMI) shield, including a connecting element extending vertically from the carrier surface and a shield layer the connecting element and the shield layer being discrete components. The package further comprises an encapsulant covering the dies and partially covering the connecting element except for an exposed portion. The connecting element includes an angular portion in a region of the exposed portion. The shield layer is disposed over the package body and connected to the exposed angular portion of the connecting element.

Another of the present embodiments comprises a method of making a semiconductor device package. The method comprises on a substrate including a carrier surface, coupling a plurality of dies to the carrier surface and electrically connecting the dies to the substrate. The method further comprises forming a first grounding segment on the carrier surface, and a plurality of second grounding segments on a periphery of the substrate. The method further comprises forming an electromagnetic interference (EMI) shield, including a connecting element and a shield layer that are discrete components. The method further comprises forming a package body coupled to the carrier surface and covering the dies and partially covering the package body except for an exposed portion spaced from the substrate. The connecting element is coupled to the first grounding segment and extends between adjacent ones of the dies, thereby dividing the semiconductor device package into a plurality of compartments, with each compartment containing at least one of the dies. The shield layer covers the package body and the exposed portion of the connecting element.

Figure 1:
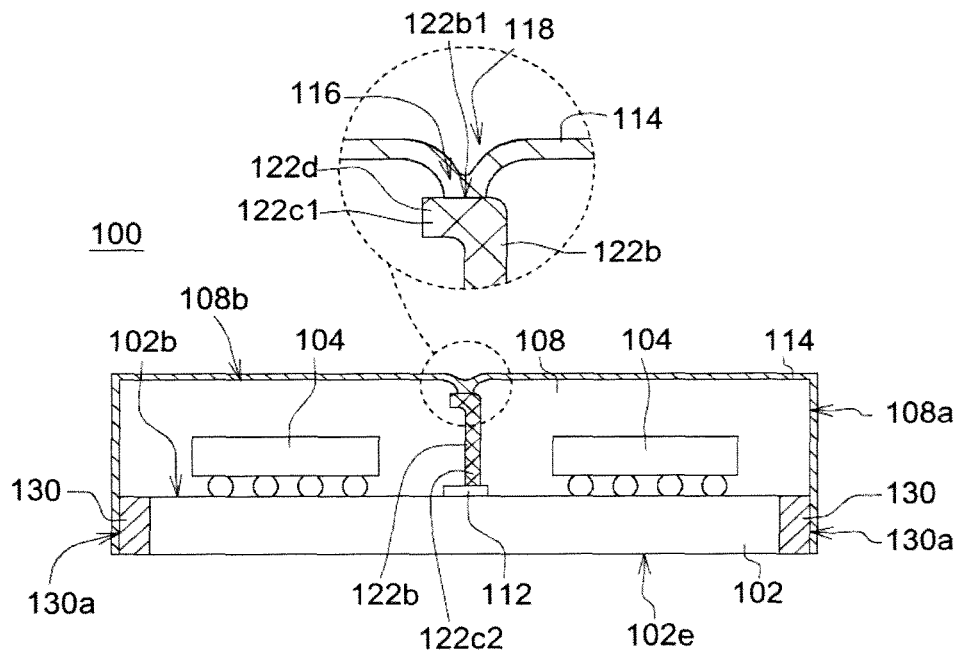
FIG. 1 is a cross-sectional view of a semiconductor device package according to one of the present embodiments, taken through the line 1-1 in FIG. 2.

Common reference numerals are used throughout the drawings and the detailed description to indicate the same elements. The present invention will be more apparent from the following detailed description taken in conjunction with the accompanying drawings.

DETAILED DESCRIPTION

Figure 2:
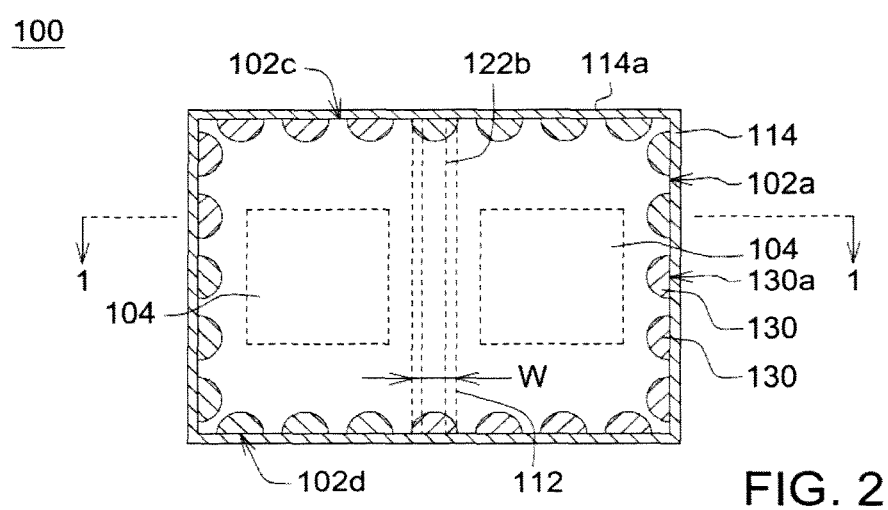
FIG. 2 is a bottom plan view of the semiconductor device package of FIG. 1.

Referring to FIGS. 1 and 2 one of the present embodiments of a semiconductor device package 100 is illustrated. The semiconductor device package 100 may, for example and without limitation, be adapted for use in a communication module or a wireless communication system. With reference to FIG. 1, the package 100 includes a substrate 102, a plurality of semiconductor devices or dies 104, a plurality of passive elements (not illustrated), a connecting element 122b, a package body 108, an electromagnetic interference (EMI) shield layer 114, a first grounding segment 112 and a second grounding segment 130. With reference to FIG. 2, which illustrates a bottom plan view of the package 100, the package 100 includes a plurality of second grounding segments 130 extending around a periphery of the substrate 102.

With reference to FIG. 1, the substrate 102 includes a carrier surface 102b, a lower surface 102e opposite the carrier surface 102b, and a lateral surface 102a at a periphery of the substrate 102. The lateral surface 102a extends between the carrier surface 102b and the lower surface 102e, and circumscribes the substrate 102. The substrate 102 may further include a protection layer (e.g. a solder mask layer, not shown) on the upper surface 102b, from which the first grounding segment 112 is exposed. The first grounding segment 112 may be exposed from the protection layer by one contiguous opening or a plurality of discrete openings.

The dies 104 may, for example and without limitation, include MicroElectroMechanical Systems (MEMS) devices. The dies 104 are coupled to the carrier surface 102b of the substrate 102 in a "face down" orientation and electrically connected to the substrate 102 via a plurality of solder balls. This configuration is sometimes referred to as "flip chip." In other embodiments, the dies 104 may be coupled to the substrate 102 in a "face up" orientation, and electrically connected to the substrate 102 via a plurality of conductive bond wires.

With further reference to FIG. 1, the second grounding segments 130 may comprise one or more conductive vias extending between the carrier surface 102b and the lower surface 102e and coupled to the periphery of the substrate 102. With reference to FIG. 2, as illustrated the second grounding segments 130 are portions of conductive vias. For example, portions of the conductive vias were removed when the package 100 was separated from its adjacent structures during manufacture, and the remaining portions form the second grounding segments 130. In one alternative, the second grounding segments 130 are portions of conductive blind vias embedded inside the substrate 102 without passing through the substrate 102. In another alternative, the substrate 102 is a multi-layer structure with a patterned conductive layer, and the second grounding segments 130 are portions of the patterned conductive layer.

With reference to FIG. 1, the connecting element 122b is coupled to the substrate 102 through the first grounding segment 112. As mentioned above, the first grounding segment 112 may be exposed from the protection layer by a plurality of discrete openings. In such embodiments, the connecting element 122b may be coupled to the first grounding segment 112 only in the areas that are exposed from the protection layer. With reference to FIG. 2, the first grounding segment 112 extends across the entire width of the substrate 102, thereby separating the package 100 into separate compartments or regions with each compartment containing at least one of the dies 104 and, optionally, other components. The connecting element 122b thus acts as a fence or barrier between neighboring compartments so as to reduce EMI among neighboring devices. The connecting element 122b may be made from a conductive material, including various metals such as aluminum, copper and other metals and alloys.

With reference to FIG. 1, the connecting element 122b includes a first terminal 122c1 and a second terminal 122c2. The first terminal 122c1 is exposed from the package body 108 at the surface 122b1. The EMI shield layer 114 is connected to the connecting element 122b at the surface 122b1. The second terminal 122c2 is electrically coupled to the first grounding segment 112. The connecting element 122b includes a laterally extending portion 122d or angular portion in the region of the first terminal 122c1. The laterally extending portion 122d extends at a substantially right angle from the connecting element 122b, thereby increasing the surface area of the surface 122b1 for better electrical interconnection with the EMI shield layer 114.

The package body 108 is disposed over the carrier surface 102b of the substrate 102 and encapsulates the dies 104 and the connecting element 122b, except for the exposed surface 122b1. The package body 108 includes an opening 116 that exposes all or a portion of the surface 122b1. The EMI shield layer 114 includes a depression 118 overlying the opening 116. However, in alternative embodiments, for example depending on the particular manufacturing process used to create the EMI shield layer 114, the depression 118 may not be formed. The EMI shield layer 114 would thus include a substantially planar upper surface. In another alternative embodiment, the opening 116 may be filled with a conductive adhesive (not shown), which could also has the effect of making the upper surface of the EMI shield layer 114 substantially planar. In such an embodiment, the EMI shield layer 114 still can be electrically coupled to the connecting element 122b via the conductive adhesive.

In the illustrated embodiment, the EMI shield layer 114 substantially covers lateral surfaces 108a and an upper surface 108b of the package body 108, the exposed surface 122b1 of the connecting element 122b, and the second grounding segments 130. The EMI shield layer 114 may be a conformal shield. The EMI shield layer 114 may be aluminum, copper, tin, chromium, gold, silver, nickel, stainless steel or any other metal or alloy. The EMI shield layer 114 may be formed, deposited or applied by such techniques as chemical vapor deposition (CVD), electroless plating, sputtering, printing, spraying, vacuum deposition, or any other process. The thickness of the EMI shield layer 114 may be relatively small, such as on the order of microns, as compared to the overall thickness of the package 100.

With reference to FIG. 2, the dotted lines indicate the superimposed locations of the dies 104, the first grounding segment 112, and the connecting element 122b. As illustrated, the second grounding segments 130 may circumscribe the periphery of the substrate 102 and be separated from each other by portions of the substrate 102. In such a configuration, the second grounding segments 130 form a "fence" around the package 100 and provide additional EMI shielding. The illustrated plan shape of each second grounding segment 130 is semi-circular, but the second grounding segments 130 could have any plan shape, such as semi-elliptical, rectangular, etc. The second grounding segments 130 also need not have a constant width along their heights. For example, when looking toward the lateral edge of the substrate 102, the second grounding segments 130 could appear conical, funnel-shaped, or any other tapered shape. Also as shown in FIG.

2, a lateral perimeter 114a of the EMI shield layer 114 defines the outer boundary of the package 100.

With continued reference to FIG. 2, at least a portion of the second grounding segments 130 are disposed inside the substrate 102. Each of the second grounding segments 130 has a lateral surface 130a, and at least a portion of the lateral surface 130a is positioned adjacent a lateral surface 102a of the substrate 102 and electrically connected to the EMI shield layer 114. The lateral surfaces 130a are substantially flush or coplanar with the lateral surfaces 102a of the substrate 102.

The first grounding segment 112, which may be a pad or other metal trace, is coupled to the carrier surface 102b of the substrate 102. The first grounding segment 112 is further electrically coupled to a grounding segment terminal (not shown) within the substrate 102, or to selected ones of the second grounding segments 130. The first grounding segment 112 is illustrated as a rectangular shaped, contiguous segment. The length of the first grounding segment 112 is approximately equal to the length of its coupled connecting element 122b. Further, the length of the first grounding segment 112 may be approximately equal to the length (or width, depending on the layout) of the substrate 102. For example, in the embodiment of FIG. 2, the first grounding segment 112 extends from the lateral surface 102c to the lateral surface 102d, and contacts the EMI shield layer 114 at each surface 102c, 102d. In addition, the width W of the first grounding segment 112 may be as wide as or slightly wider than the width of the connecting element 122b. In one non-limiting example, the width W may be about 300 microns (μm).

Figure 3:
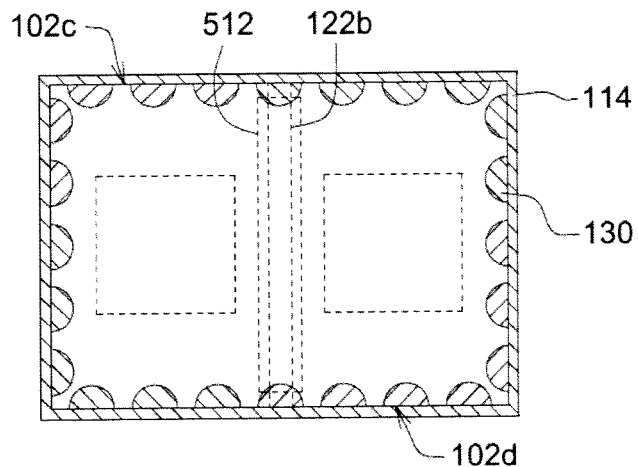
FIG. 3 is a bottom plan view of a semiconductor device package according to another of the present embodiments.

FIG. 3 is a bottom plan view of a semiconductor device package according to another of the present embodiments. A first grounding segment 512, similar to the first grounding segment 112 in FIG. 2, is shown as a rectangular contiguous segment. However, the first grounding segment 512 does not extend the full length of the substrate 102. The first grounding segment 512 thus does not extend to the lateral surface 102c or the lateral surface 102d of the substrate 102. Because the grounding segment 512 does not extend to the perimeter of the substrate 102, i.e. the lateral surfaces 102c. 102d, solder (not shown) or another material that may be used to attach the connecting element 122b to the first grounding segment 512 would not extend to or be exposed at the lateral surfaces 102c, 102d after reflow. The width of the first grounding segment 512 may be slightly larger or substantially the same as the width of the connecting element 122b. The first grounding segment 512 also may be coupled to selected ones of the second grounding segments 130.

Figure 4:
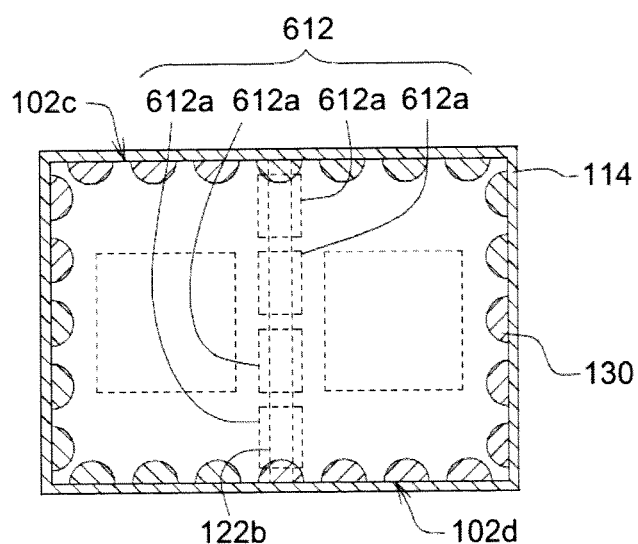
FIG. 4 is a bottom plan view of a semiconductor device package according to another of the present embodiments.

FIG. 4 is a bottom plan view of a semiconductor device package according to another of the present embodiments. A first grounding segment 612 is illustrated. The first grounding segment 612 comprises a plurality of spaced grounding segments 612a. The spaced grounding segments 612a may permit signal routing on the substrate 102 between two or more dies 104. The first grounding segment 612 does not extend to the lateral surface 102c or the lateral surface 102d. In an alternative embodiment, the first grounding segment 612 may extend to the lateral surface 102c and/or the lateral surface 102d. The width of the first grounding segment 612 may be slightly larger or substantially the same as the width of the connecting element 122b. The first grounding segment 612 also may be coupled to the second grounding segment 130. The discrete grounding segments 612a may be exposed from the previously described protection layer. For example, the protection layer may be formed between each of the discrete grounding segments 612a.

Figure 5:
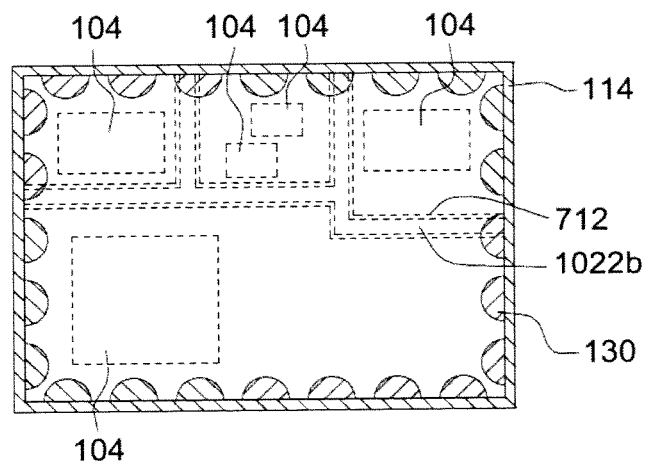
FIG. 5 is a bottom plan view of a semiconductor device package according to another of the present embodiments.

FIG. 5 is a bottom plan view of a semiconductor device package according to another of the present embodiments. In this embodiment, the substrate 102 is divided into 4 distinct compartments or regions. Each region is shielded from its adjacent regions by a first grounding element 712 and a connecting element 1022b. The first grounding element 712 is coupled to the carrier surface 102b in a desired pattern for the various regions. The connecting element 1022b is coupled to the first grounding element 712 in the same pattern. The width of the first grounding segment 712 may be slightly larger or substantially the same as the width of the connecting element 1022b. The first grounding segment 712 also may be coupled to the second grounding segment 130.

Figure 6:
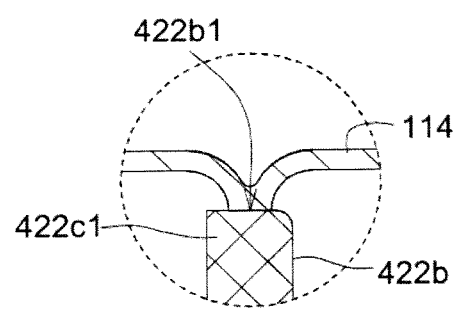
FIG. 6 is a detail view of a connecting element according to another of the present embodiments.

FIG. 6 is a detail view of a connecting element 422b according to another of the present embodiments. In this embodiment, the first terminal 422c1 of the connecting element 422b does not include a laterally extending portion, as the embodiment of FIG. 1 does. Without the laterally extending portion, a surface 422b1 of the first terminal 422c1 preferably has sufficient surface area such that robust electrical contact can be made between the EMI shield layer 114 and the connecting element 422b. The EMI shield layer 114 may cover the entire surface 422b1, or only a portion thereof as illustrated in FIG. 6.

Figure 7:
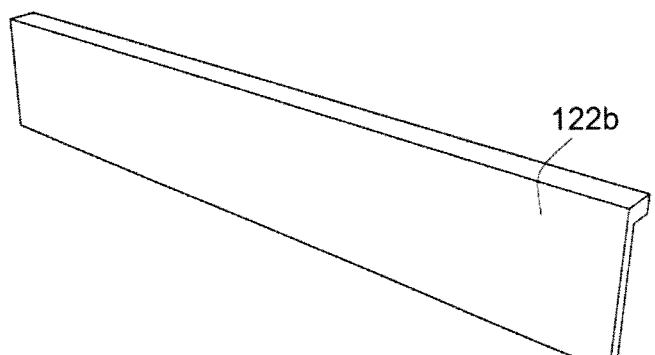
FIGS. 7-10 are perspective views of connecting elements according to several alternatives of the present embodiments.
Figure 8:
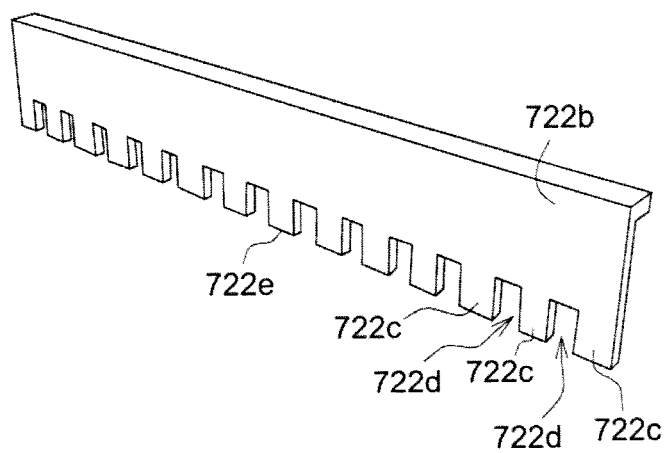
Figure 9:
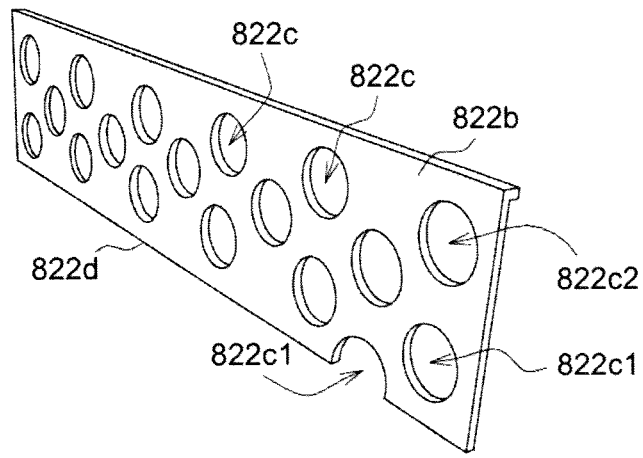
Figure 10:
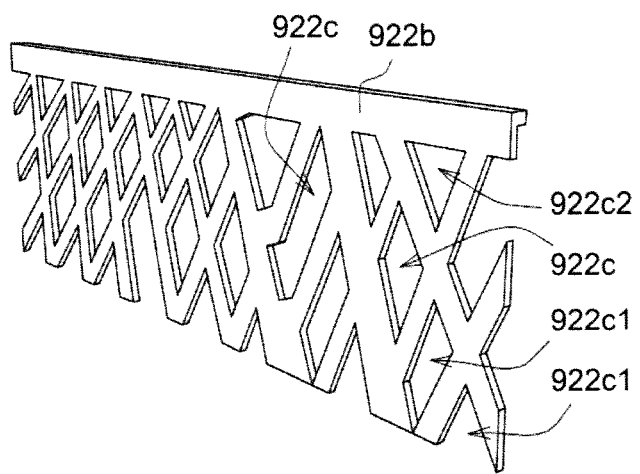

With reference to FIG. 7, the connecting element 122b may be a solid plate or segment without any openings. Alternatively, the connecting element may include one or more openings that promote flow of mold compound through the connecting element and between various regions of the substrate 102. For example, FIGS. 8-10 illustrate example configurations for openings in the connecting element. With reference to FIG. 8, the connecting element 722b has a castellated lower edge portion 722e defined by a plurality of spaced openings 722d separated by spaced segments 722c. With reference to FIG. 9, the connecting element 822b has a plurality of spaced circular openings 822c arranged in a repeating pattern or alternatively in an asymmetrical arrangement. At least one of the openings 822c 1 may extend to a lower edge 822d of the connecting element 822b. With reference to FIG. 10, the connecting element 922b has a mesh, screen, or grate structure with a plurality of openings 922c. Compared with connecting elements 722b, 822b, 922b, the solid connecting element 122b of FIG. 7 may provide more effective EMI protection to neighboring semiconductor devices 104, depending upon various parameters of the EMI, such as strength, wavelength and frequency.

The various openings in the connecting elements 722b, 822b. 922b may extend along an upper portion or a lower edge of the connecting elements 722b, 822b, 922b, depending, for example, on how the semiconductor devices 104 are electrically connected to the substrate 102. For a flip chip application, it may be advantageous to place at least some of the openings along the lower edge of the connecting elements 722b, 822b, 922b, as illustrated by the openings 722d in FIG. 8, the openings 822c1 in FIG. 9, and the openings 922c1 in FIG. 10. Openings placed along the lower edge promote the mold compound filling the spaces between the semiconductor devices 104 and the substrate 102, thereby providing an underfill. In a wire bond application, at least some of the openings may extend along the upper portion of the connecting element, as illustrated by the openings 822c2 in FIG. 9 and the openings 922c2 in FIG. 10. So locating the openings 822c2, 922c2 facilitates the package body material covering the bond wires.

Figure 11A:
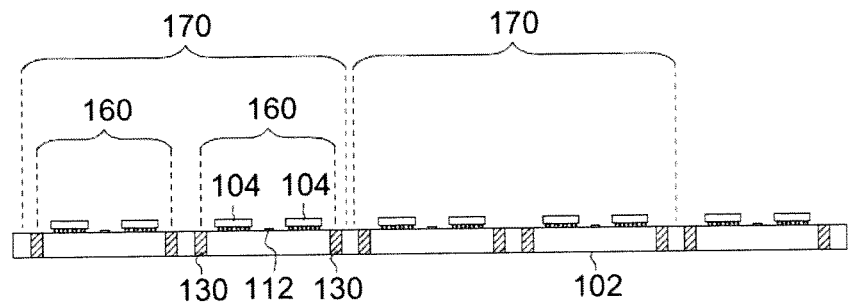
FIGS. 11A-11G are views from various perspectives of steps in one embodiment of a method of making the semiconductor device package of FIG. 1.

FIGS. 11A-11G illustrate one embodiment of a method of making the semiconductor device package of FIG. 1. With reference to FIG. 11A, the substrate 102 is illustrated. The substrate 102 includes a plurality of module sites 160 and a plurality of frame sites 170, wherein each frame site 170 includes a plurality of module sites 160. In a later process step, the module sites 160 will be singulated from one another. The plurality of dies 104 are coupled to the substrate 102, with each module site 160 comprising a plurality of the dies 104. The plurality of first grounding segments 112 and the plurality of second grounding segments 130 are applied to the substrate 102.

Figure 11B:
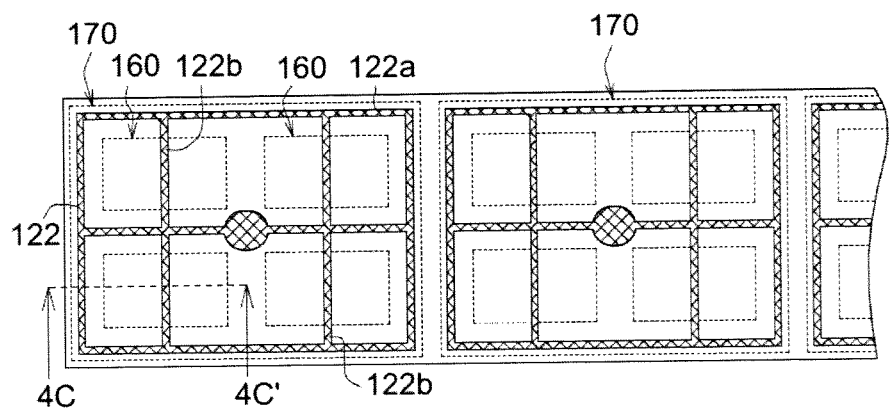

With reference to FIG. 11B, one or more EMI shield fences 122 are coupled to the substrate 102. Each EMI shield fence 122 extends around and defines its corresponding fence site 170. The EMI shield fence 122 compartmentalizes the module site 160 into various shielded regions, which when combined with the EMI shield layer 114 and the various grounding elements shields the dies 104 from each other as well as from external EMI.

Figure 11C:
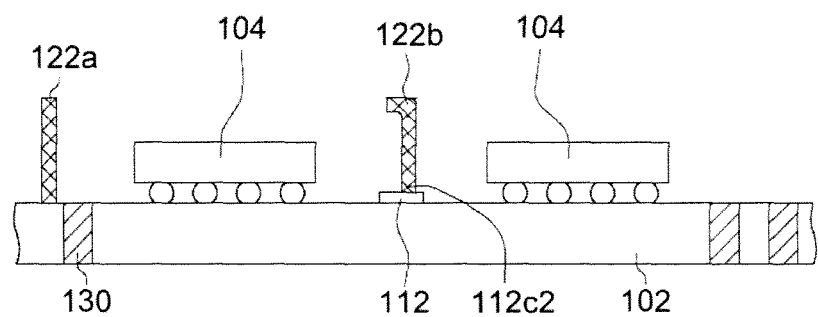

With reference to FIG. 11C, each EMI shield fence 122 includes one or more edge feet 122a and one or more connecting elements 122b, which are connected to the edge feet 122a to form a continuous frame, as shown in FIG. 11B. The edge feet 122a are positioned outside the module site 160, but within the fence site 170. As shown, the edge feet 122a are also positioned outside the second grounding segment 130. However, in alternative embodiments the edge feet 122a could be positioned inside the second grounding segment 130. At least a portion of the connecting element 122b is positioned within the module site 160. The terminal 122c2 of the connecting element 122b is coupled to a corresponding first grounding segment 112. The EMI shield fence 122 may be made from a conductive material, such as a metal. Example metals include, without limitation, aluminum, copper, stainless steel, and various alloys, such as copper-nickel-zinc. The EMI shield fence 122 can be fabricated from a single plate, which may be stamped, etched or otherwise cut to form the desired geometry.

Figure 11D:
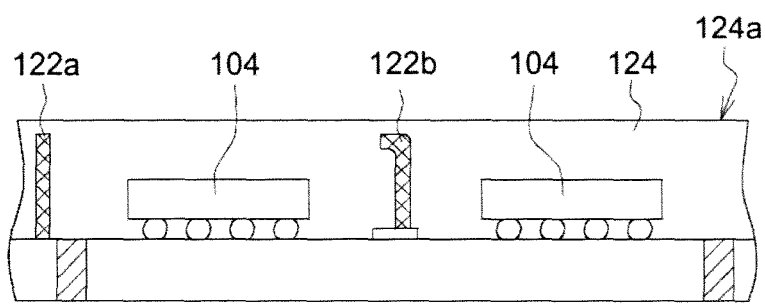

With reference to FIG. 11D, a package material, mold compound, or encapsulant 124 is applied to cover the dies 104 as well as the edge feet 122a and the connecting elements 122b of the EMI shield fence 122. Due to tolerances of the molding process, and a desire to prevent damage to the molding equipment, an upper surface 124a of the package material 124 may be taller than the EMI shield fence 122. The connecting elements 122b of the EMI shield fence 122 are thus encapsulated by the package material 124. Alternatively, if the molding process is finely controlled, the top surface 124a may be substantially coplanar with the upper surface 122b1, with the surface 122b1 being exposed from the upper surface 124a of the package material 124. The package material 124 can be formed using any of a number of molding techniques, such as compression molding, injection molding, transfer molding, or any other technique. The package material 124 thus forms the previously described package body 108.

Figure 11E:
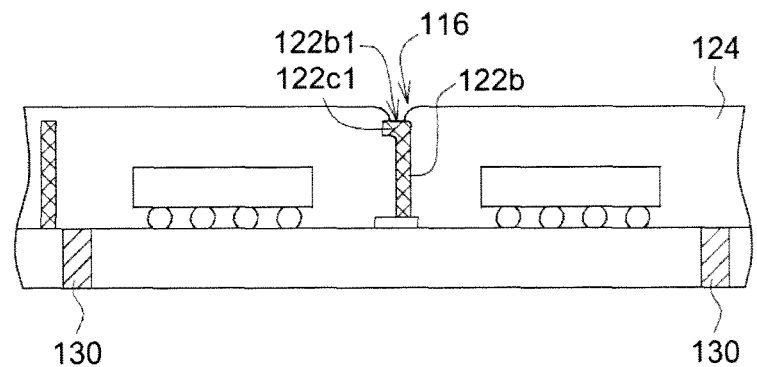

With reference to FIG. 11E, an opening 116 is formed on the part of the package material 124 adjacent the connecting element 122b. The opening 116 may be formed by laser ablation, machine drilling, or any other encapsulant removal technology. Each opening 116 exposes the surface 122b1 of the terminal 122c1 of the corresponding connecting element 122b.

Figure 11F:
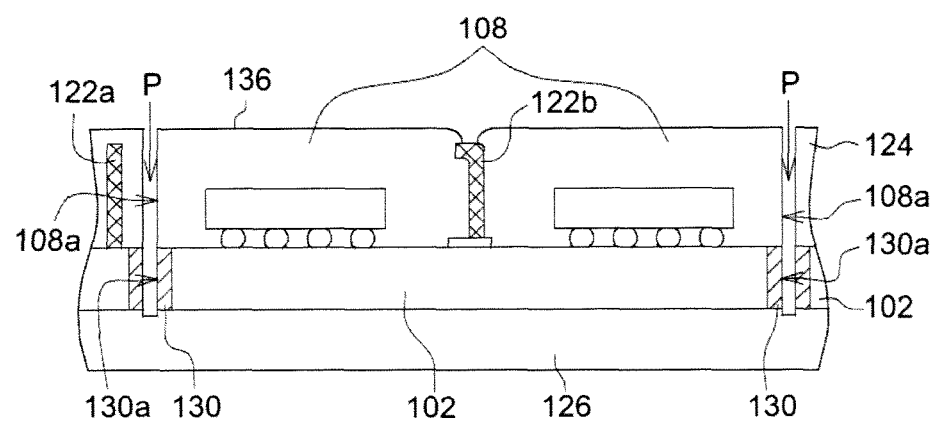

With reference to FIG. 11F, individual packages 136 are singulated from one another at the locations P. Each package 136 includes the package material 124, the substrate 102, the second grounding segment 130 and the EMI shield fence 122. The singulation process exposes lateral surfaces 108a of the package body 108 and lateral surfaces 130a of the second grounding elements 130. After the packages 136 are singulated, the connecting element 122b remains with the package 136, but the edge feet 122a are removed and discarded. In one embodiment, the substrate 102 may singulated while the substrate 102 is attached to a carrier 126 by an adhesion layer (not shown). The singulation path P may reach the adhesion layer, but may or may not penetrate the carrier 126. In the present embodiments, the singulation may be performed by sawing.

Figure 11G:
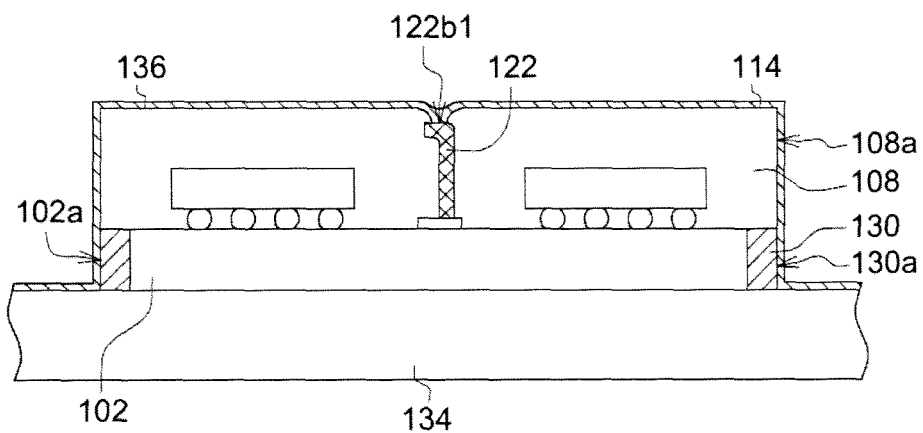

With reference to FIG. 11G, where only one package structure 136 is illustrated, each package structure 136 is disposed on a carrying plate 134 after the package structure 136 is separated from the carrier 126. For example, the package structure 136 may be separated from the carrier 126 by peeling. Then, the EMI shield layer 114 is formed. The EMI shield layer 114 covers at least a portion of the package body 108, including its lateral surfaces 108a, lateral surfaces 102a of the substrate 102, the surface 122b1 of the connecting element 122b, and lateral surfaces 130a of the second grounding segments 130. After the EMI shield layer 114 is formed, the semiconductor device package 100 is separated from the carrying plate 134. For example, the semiconductor device package 100 may be separated from the carrying plate 134 by peeling.

Figure 12:
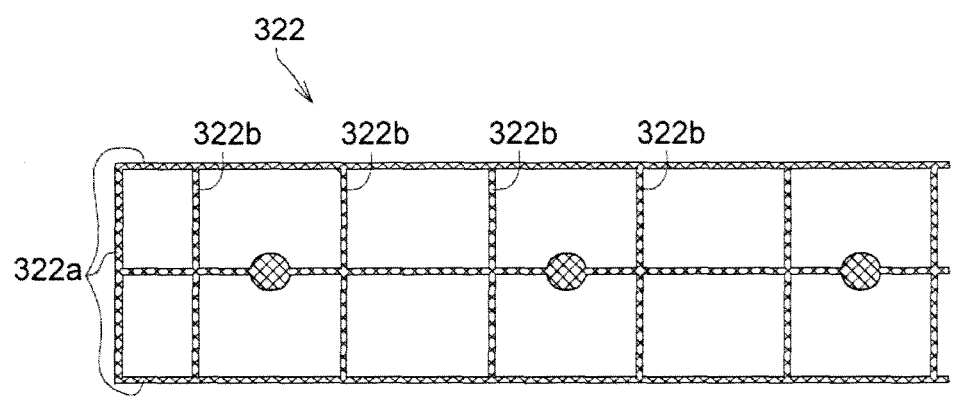
FIG. 12 is a top plan view of an EMI shield frame according to another of the present embodiments.

FIG. 12 illustrates a top view of an EMI shield fence 322 according to another of the present embodiments. The EMI shield fence 322 is a unitary piece including a plurality of edge feet 322a, i.e. elements that form the perimeter of the fence 322 to provide structural integrity, and connecting elements 322b. The EMI shield fence 322 is thus configured to be placed as a single unit over an entire substrate strip and/or panel. This structure is in contrast with the EMI shield fence 122 of FIG. 11B, in which each fence site 170 has a discrete fence structure.

Figure 13:
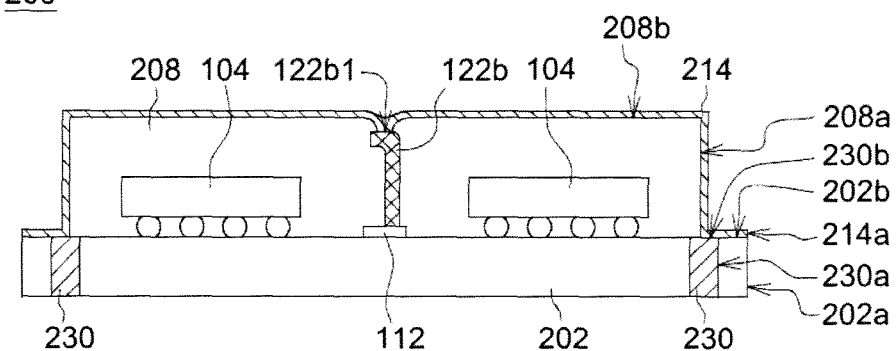
FIG. 13 is a cross-sectional view of a semiconductor device package according to another of the present embodiments.

FIG. 13 illustrates a cross-sectional view of a semiconductor device package 200 according to another of the present embodiments. The semiconductor device package 200 includes a substrate 202, a plurality of dies 104, a plurality of passive elements (not illustrated), a connecting element 122b, a package body 208, an EMI shield layer 214, a first grounding segment 112 and a second grounding segment 230. The semiconductor device package 200 differs from the semiconductor device package 100 of FIG. 1 in that the EMI shield layer 214 contacts an upper surface 230b of the second grounding segment 230, rather than lateral surfaces 230a thereof.

The second grounding segment 230 is coupled to the periphery of the substrate 202, and at least a portion of the second grounding segment 230 is disposed inside the substrate 202, i.e. within the perimeter of the substrate 202 similar to a via. The upper surface 230b is exposed adjacent and substantially coplanar with a carrier surface 202b, or die mounting surface, of the substrate 202. In addition, the lateral surface 202a of the substrate 202 is substantially coplanar with the lateral surface 214a of the EMI shield layer 214.

The EMI shield layer 214 is a conformal shield that covers at least a portion of the lateral surface 208a and at least a portion of the upper surface 208b of the package body 208, the surface 122b1 of the connecting element 122b, a portion of the upper surface 230b of the second grounding segment 230, and a portion of the carrier surface 202b of the substrate 202. Each semiconductor device 104 is surrounded by an EMI shield layer 214 and the connecting element 122b. The connecting elements 122b and the EMI shield layer 214 separate the dies 104 to reduce EMI between the dies 104 in their compartmentalized regions, and to reduce external EMI directed toward the dies 104.

Figure 14A:
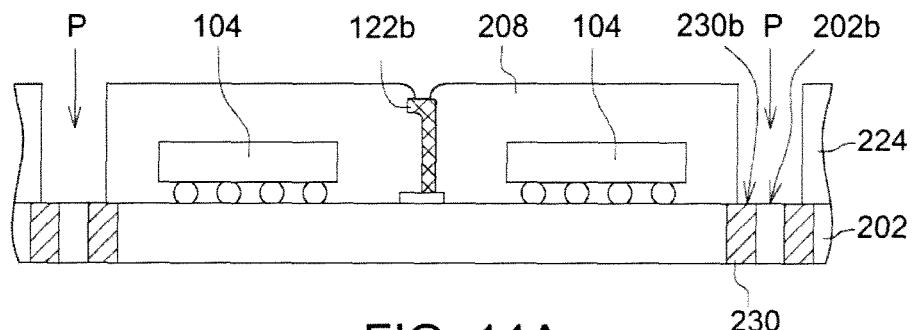
FIGS. 14A-14B are cross-sectional views of steps in one embodiment of a method of making the semiconductor device package of FIG. 13.
Figure 14B:
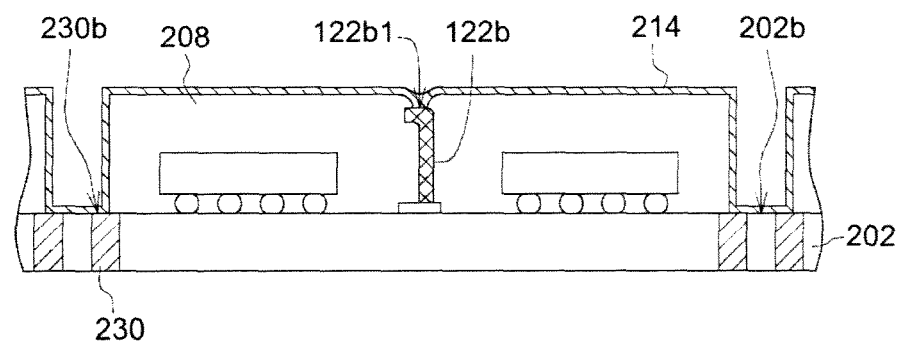

FIGS. 14A and 14B illustrate one embodiment of a method of making the semiconductor device package of FIG. 13. In this manufacturing process, the steps forming the substrate to forming the opening in the package body 208 are similar to the steps described above with respect to the semiconductor device package 100, and are therefore not repeated here.

With reference to FIG. 14A, a package material 224 and the EMI shield fence 122 (not illustrated in FIG. 14A) are singulated, wherein the package material 224 is separated into a plurality of package bodies 208, and the upper surface 230b of the second grounding segment 230 is exposed after the package body 224 is separated. In the present embodiments, the singulating path P stops when it reaches a carrier surface 220b of the substrate 220, instead of passing through the substrate 220. In another embodiment, the singulating path P can slightly penetrate a portion of the second grounding segment 230, but does not fully cut through the second grounding segment 230.

With reference to FIG. 14B, an EMI shield layer 214 is formed and covers the exterior surface of the package body 208, the carrier surface 202b of the substrate 220, the surface 122b1 of the connecting element 122b and the upper surface 230b of the second grounding segment 230. Then, the EMI shield layer 214 and the substrate 220 are singulated to form a plurality of semiconductor device packages 200 as illustrated in FIG. 13. In the singulating step of the present embodiments, the second grounding segment 230 is not cut, so that the lateral surface of the second grounding segment 230 is not exposed. Alternatively, the singulating path can reach the second grounding segment 230, so that a lateral surface of the second grounding element 230 is exposed after singulation.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device package, comprising:
    a substrate including a carrier surface;
    a plurality of dies coupled to the carrier surface of the substrate and electrically connected to the substrate;
    an electromagnetic interference (EMI) shield, including a connecting element and a shield layer that are discrete components, the connecting element including a first end and a second end opposite the first end, wherein the first end has a larger, lateral surface area than the second end;
    a first grounding segment coupled to the carrier surface, wherein the second end of the connecting element is coupled to the first grounding segment;
    at least one second grounding segment disposed at a periphery of the substrate wherein the shield layer is coupled to the at least one second grounding segment; and
    a package body covering the dies and partially covering the first end of the connecting element, a portion of the first end of the connecting element spaced from the substrate being exposed from the package body;
    wherein the connecting element extends between adjacent ones of the dies, thereby dividing the semiconductor device package into a plurality of compartments, with each compartment containing at least one of the dies; and
    wherein the shield layer is disposed over the package body and the exposed portion of the first end of the connecting element.

2. The semiconductor device package of claim 1, further comprising a plurality of second grounding segments, and wherein the second grounding segments circumscribe the periphery of substrate and provide additional EMI shielding to the semiconductor device package.

3. The semiconductor device package of claim 2, wherein the shield layer is coupled to lateral surfaces of the second grounding segments.

4. The semiconductor device package of claim 1, wherein the shield layer is coupled to the first grounding segment through the connecting element.

5. The semiconductor device package of claim 1, wherein the package body has an opening corresponding to the exposed portion of the connecting element, and the shield layer has a depression overlying the opening.

6. The semiconductor device package of claim 1, wherein the connecting element includes an angular portion in a region of the exposed portion.

7. A semiconductor device package, comprising:
    a substrate including a carrier surface;
    a plurality of dies coupled to the carrier surface of the substrate and electrically connected to the substrate, wherein each of the plurality of dies has an active surface;
    an electromagnetic interference (EMI) shield, including a connecting element extending vertically from the carrier surface and a shield layer, the connecting element and the shield layer being discrete components;
    a first grounding segment coupled to the carrier surface, and a plurality of second grounding segments coupled to a periphery of the substrate, wherein the first grounding segment is coupled to a first end of the connecting element; and
    an encapsulant covering the dies and partially covering the connecting element including at least two oppositely facing surfaces of the connecting element, an exposed portion of the connecting element being opposite the first end of the connecting element and uncovered by the encapsulant;
    wherein the connecting element includes an angular portion in a region of the exposed portion such that the angular portion comprises a larger lateral surface area than a lateral surface area of the first end of the connecting element; and
    wherein the shield layer is disposed over the package body and connected to the exposed angular portion of the connecting element.

8. The semiconductor device package of claim 7, wherein the active surface of at least one of the dies faces the substrate and wherein the connecting element includes a plurality of openings that promote the encapsulant to underfill the die.

9. The semiconductor device package of claim 7, wherein at least one of the dies is electrically connected to the substrate by at least one wirebond and wherein the connecting element includes a plurality of openings that promote the encapsulant covering the at least one wirebond.

10. The semiconductor device package of claim 9, wherein the openings extend along a length of the connecting element at an edge that is adjacent the substrate.

11. The semiconductor device package of claim 10, wherein a subset of the openings are diamond shaped and arranged in a grid pattern.

12. The semiconductor device package of claim 7, wherein the shield layer has a depression overlying the exposed angular portion of the connecting element.

13. The semiconductor device package of claim 7, wherein the connecting element is electrically connected to the first grounding segment and the shield layer is electrically connected to at least one of the plurality of the second grounding segments.

14. A semiconductor device package, comprising:
a substrate including a carrier surface;
a plurality of dies coupled to the carrier surface of the substrate and electrically connected to the substrate, wherein each of the plurality of dies has an active surface;
an electromagnetic interference (EMI) shield, including a connecting element extending vertically from the carrier surface and a shield layer, the connecting element and the shield layer being discrete components;
a plurality of first grounding segments coupled to a periphery of the substrate; and
an encapsulant covering the dies and partially covering the connecting element including at least two oppositely facing surfaces of the connecting element, an exposed portion of the connecting element being opposite a first end of the connecting element and uncovered by the encapsulant;
wherein the connecting element includes an angular portion in a region of the exposed portion such that the angular portion comprises a larger, lateral surface area than a lateral surface area of the first end of the connecting element; and
wherein the shield layer is disposed over the package body and connected to the exposed angular portion of the connecting element so that the connecting element is coupled to the first grounding segment through the shield layer.

15. The semiconductor device package of claim 14 wherein the active surface of at least one of the dies faces the substrate and wherein the connecting element includes a plurality of openings that promote the encapsulant to underfill the die.

16. The semiconductor device package of claim 14, wherein at least one of the dies is electrically connected to the substrate by at least one wirebond and wherein the connecting element includes a plurality of openings that promote the encapsulant covering the at least one wirebond.

17. The semiconductor device package of claim 16, wherein a subset of the openings are diamond shaped and arranged in a grid pattern.

18. The semiconductor device package of claim 14, wherein the shield layer has a depression overlying the exposed angular portion of the connecting element.

19. The semiconductor device package of claim 14 wherein the connecting element is electrically connected to a second grounding segment coupled to the substrate.

20. The semiconductor device package of claim 19 wherein the shield layer is coupled to the second grounding segment through the connecting element.

* * * * *